(12) United States Patent
Perez et al.

(10) Patent No.: US 6,252,528 B1
(45) Date of Patent: Jun. 26, 2001

(54) SYSTEM AND METHOD FOR VARIABLE GAIN CODER-DECODER

(75) Inventors: Robert K. Perez, Laguna Beach; Norman J. Beamish, Costa Mesa, both of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/378,325

(22) Filed: Aug. 20, 1999

(51) Int. Cl.⁷ ...................................................... H03M 1/18
(52) U.S. Cl. ............................................. 341/110; 341/139
(58) Field of Search .................................... 341/110, 155, 341/139, 132

(56) References Cited

U.S. PATENT DOCUMENTS 5,684,480 * 11/1997 Jannson ................................ 341/139
5,844,512 * 12/1998 Gorin .................................. 341/139

* cited by examiner

*Primary Examiner*—Brian Young
(74) *Attorney, Agent, or Firm*—Christopher J. Rourk; Akin Gump Strauss Hauer & Feld, L.L.P.

(57) ABSTRACT

A variable gain coder-decoder is provided. The variable gain coder-decoder includes a variable gain amplifier in which the amplification gain may be adjusted in one-decibel steps. An analog to digital converter is connected to the variable gain amplifier. The analog to digital converter receives the amplified output of the amplifier, and performs an analog to digital conversion of the amplified output.

20 Claims, 2 Drawing Sheets

SYSTEM AND METHOD FOR VARIABLE GAIN CODER-DECODER

FIELD OF THE INVENTION

The present invention pertains to variable gain coder-decoders, and more particularly to a variable gain coder-decoder for use with telephone line signals.

BACKGROUND

Coder-decoders are used in telecommunications equipment for diverse purposes. Typically, a coder-decoder refers to an analog to digital converter and a digital to analog converter that are contained within the same circuit, such that two-way data communications may be performed between analog systems and digital systems. The coder-decoder thus "codes" analog information into a digital format, and "decodes" digital information into an analog format.

Coder-decoders may be used in conjunction with amplification when the signal received at the coder-decoder input would otherwise be too weak to be correctly decoded. External amplification devices may be utilized for such purposes, but these devices typically drive up the cost of the overall system that utilizes the amplifier and the coder decoder. They must be separately manufactured and installed, which creates additional costs and decreases overall system reliability. For this reason, coder-decoders with internal amplification systems have been developed.

Nevertheless, such coder-decoders with internal amplification systems have drawbacks that limit the usefulness of the coder-decoder. If a large amplification gain is used, the amplification system may be easily driven into saturation. If a small amplification gain is used, then it may still be necessary to have additional external amplification installed. For these reasons, it is often necessary to design the amplification for each coder-decoder to meet the needs of the system that it is being used in.

For certain applications, this constraint for coder-decoders can result in non-optimal configurations. For example, it is often desirable to obtain signals from a telephone line, such as caller identification signals, while the line is on-hook. An AC bypass path may be provided by connecting a capacitor across the hook relay. Known coder-decoders require a large capacitance to be used, because otherwise, signal attenuation will result in a caller identification signal that is too weak to be used. If the signal is amplified, then the data channel signal (carrying voice data, digitally-encoded data, or other suitable communications data that may be transmitted when the receiver is off-hook) that is received when the line is off-hook will saturate the amplifier. This configuration is undesirable, as it results in a hook impedance that does not meet industry standards.

SUMMARY OF THE INVENTION

The present invention provides a variable gain coder-decoder, in which the amplification gain may be adjusted to prevent the amplifier from being driven into saturation.

In accordance with one aspect of the present invention, a variable gain coder-decoder is provided. The variable gain coder-decoder includes a variable gain amplifier in which the amplification gain may be adjusted in one-decibel steps. An analog to digital converter is connected to the variable gain amplifier, receives the amplified output of the amplifier, and performs an analog to digital conversion of the amplified output.

In accordance with another aspect of the present invention, a system for transferring data over a communications medium, such as a telephone line, having a variable impedance load, such as a hook and a hook state, is provided. The system includes a relay coupled to the telephone, such as a hook relay. The hook relay can selectively block and transmit a communications signal from the telephone line. A bandpass filter is connected in parallel with the hook relay. A variable-gain coder-decoder is connected to the bandpass filter and the hook relay. The variable gain coder-decoder amplifies a bandpass signal at a high level when the hook relay is blocking, to compensate for signal loss through the bandpass filter. The variable gain coder-decoder amplifies the communications signal at a lower level when the relay is transmitting, because the signal loss through the bandpass filter is no longer present.

The variable gain coder-decoder of the present invention provides many important technical advantages. One important technical advantage of the present invention is a variable gain coder-decoder that may be used to process signals having a variable input level, such that a weak signal may be processed until such time as a stronger signal is received. The gain of the variable gain coder-decoder may then be adjusted in one-decibel steps so as to prevent the amplifier of the variable gain coder-decoder from being driven into saturation.

Those skilled in the art will further appreciate the advantages and superior features of the invention together with other important aspects thereof on reading the detailed description which follows in conjunction with the drawings.

DETAILED DESCRIPTION OF PREFERRED EMBODIMENTS

Figure 1:
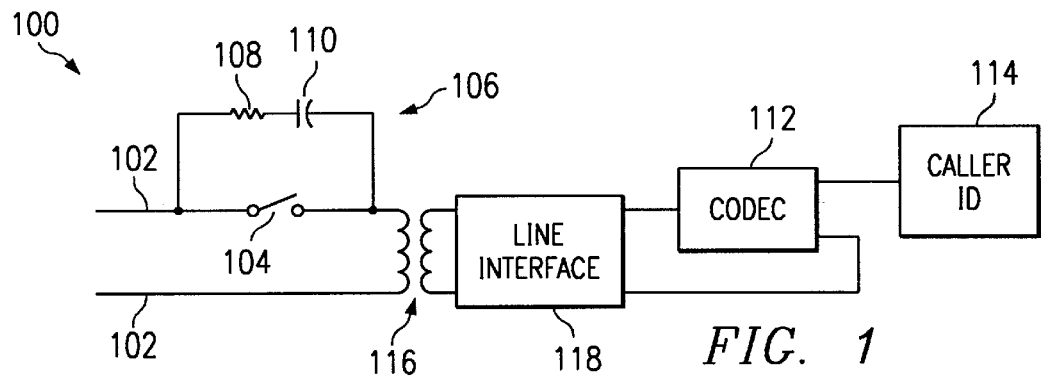
FIG. 1 is a diagram of a communication system in accordance with an exemplary embodiment of the present invention.

In the description which follows, like parts are marked throughout the specification and drawing with the same reference numerals, respectively. The drawing figures may not be to scale and certain components may be shown in generalized or schematic form and identified by commercial designations in the interest of clarity and conciseness.

FIG. 1 is a diagram of a communication system 100 in accordance with an exemplary embodiment of the present invention. Communication system 100 includes a coder-decoder with adjustable amplification gain, such that on-hook data signals such as caller identification signals or analog display services interface signals may be received via an alternative current (AC) bypass path from a telecommunications line 102 when a telephone is on-hook. The adjustable amplification gain allows such on-hook data signals to be amplified to level that allows the signals to be processed. The adjustable amplification gain may then be decreased when an off-hook data signal is received, such as voice data or digitally encoded data for use by a personal computer, so as to allow the off-hook data signal to be processed.

Communication system 100 includes telecommunications line 102 and relay 104. Telecommunications line 102 is a public switched telephone network line that is coupled to a remote switch or terminal, a central office switch, or other suitable public switched telephone network interface devices. Telecommunications line 102 may comprise a twisted conductor pair, a pair of copper conductors, or other suitable communications media.

As used in this application, the term "coupled" refers to an electrical connection (such as a copper wire or soldered connection), a logical connection (such as through logical devices of a semiconductor device), a virtual connection (such as through randomly assigned memory locations of a memory device), or other suitable connections. A combination or series of connections may also be used, as well as connections formed through intervening devices.

Relay 104 may comprise a hook relay, such as a hook relay found in telephone handsets, a relay that performs the function of a hook relay for a cordless telephone handset, or other suitable relays. Relay 104 is operable to controllably connect and separate telecommunications line 102 from line interface 118, coder-decoder 112 and caller identification unit 114, and includes isolation transformer 116. In addition, resistor 108 and capacitor 110 are connected in series across relay 104, such that resistor 108 and capacitor 110 form AC bypass path 106 when relay 104 is open.

Resistor 108 and capacitor 110 may be selected so as to present a hook impedance meeting standard values for on-hook impedances. Alternatively, other components or circuit elements may be used to form AC bypass path 106, including but not limited to electronic devices.

Coder-decoder 112 is an interface device that is operable to receive an analog signal and to generate a digital signal output, and to receive a digital signal input and to generate an analog signal output. For example, coder-decoder 112 may be an application-specific integrated circuit, a field programmable gate array, or other suitable devices. Coder-decoder 112 may be implemented in silicon, germanium, or other suitable semiconducting substrate materials.

Coder-decoder 112 includes adjustable gain amplification functionality that allows the loss developed across AC bypass path 106 to be compensated for when relay 104 is open. For example, if relay 104 is a hook relay, then when the telephone handset is on-hook, relay 104 will be open, thus changing the impedance of the line such that off-hook data signals will not be transmitted to coder-decoder 112. Nevertheless, AC bypass path 106 will allow on-hook data signals, which typically comprise high frequency signals, to propagate beyond relay 104 and to reach coder-decoder 112. Coder-decoder 112 is operable to increase the amplification provided to such high-frequency on-hook line signals that are transmitted by AC bypass path 106, such that any attenuation through AC bypass path 106 may be compensated for.

When relay 104 is actuated, such as when the telephone handset is taken off-hook, off-hook data signals may be transmitted from telecommunications line 102 to coder-decoder 112. These off-hook data signals will not experience the loss in signal strength that is experienced by the on-hook data signals transmitted through AC bypass path 106, and are therefore received at a greater signal strength than the on-hook data signals transmitted through AC bypass path 106. If coder-decoder 112 amplifies these off-hook data signals at the same level of amplification gain that was used for the on-hook data signals transmitted through AC bypass path 106, then the amplification system may be driven into saturation, resulting in the distortion of the amplified signals. Coder-decoder 112 is operable to detect changes in line signal strength, or to receive a signal signifying a change in the status of the hook condition, and to adjust the amplification ratio such that the line signal does not drive the amplification functionality of coder-decoder 112 into saturation.

Caller identification unit 114 is coupled to coder-decoder 112, and is operable to receive a digital signal output from coder-decoder 112 and to generate caller identification display information. For example, coder-decoder 112 may receive predetermined caller identification frequency encoded data through AC bypass path 106, and may convert the analog signal to digital signals. Caller identification unit 114 receives the digital signals from coder-decoder 112, and processes the digital signals to generate and display the name, telephone number, time, and other relevant information of the party placing the call.

In operation, communication system 100 is used to receive on-hook data channel signals, including caller identification or analog call identification service signals, over telecommunications line 102. Coder-decoder 112 includes amplification functionality that allows the signal loss across a AC bypass path 106 to be compensated for. A user may adjust the amplification ratio of coder-decoder 112, such that coder-decoder 112 may offset the exact signal loss across AC bypass path 106, transformer 116, and line interface 118 when relay 104 is in a blocking mode.

In this manner, coder-decoder 112 amplifies an on-hook data signal, such as a caller identification or analog display services indicator signal, allowing the AC bypass path to be selected so that the hook impedance of communications system 100 as seen from the telecommunications line 102 meets industry standard values. Furthermore, coder-decoder 112 adjusts the amplification of the line signal to a lower level when relay 104 is off-hook, such that the amplification functionality in coder-decoder 112 is not driven into saturation when off-hook data signals are received that have not been attenuated.

Figure 2:
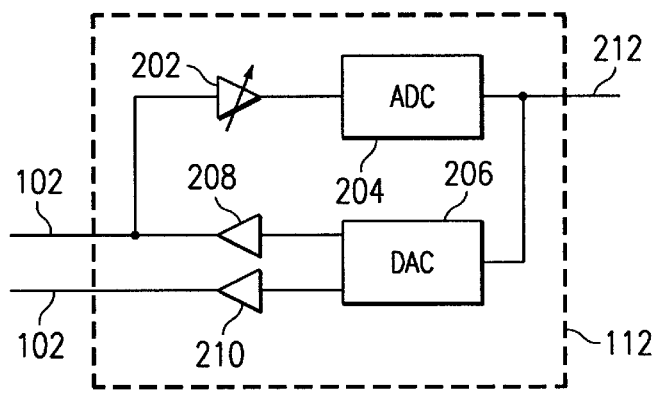
FIG. 2 is a block diagram of a coder-decoder in accordance with an exemplary embodiment of the present invention.

FIG. 2 is a block diagram of a coder-decoder 112 in accordance with an exemplary embodiment of the present invention. Coder-decoder 112 may be implemented in hardware or a suitable combination of hardware and software, and is preferably a semiconducting device formed on a semiconducting material wafer substrate. For example, coder-decoder 112 may be a semiconducting silicon device that is formed from a series of etching, deposition, and masking operations.

Coder-decoder 112 includes variable gain operational amplifier 202 which is connected in series to analog-to-digital converter 204 and to telecommunications line 102. Variable gain operational amplifier 202 is operable to receive a signal from telecommunications line 102 and to apply a variable level of amplification to that signal. For example, variable gain operational amplifier 202 may include control data inputs that are used to prompt data registers to determine the appropriate amplification ratio, or may have an amplification gain input that is coupled to a register that is externally adjusted to provide the appropriate gain for existing circuit conditions. Variable gain operational amplifier 202 thus receives a signal from telecommunications line 102 and amplifies the signal according to a predetermined amplification ratio.

Analog-to-digital converter 204 is coupled to variable gain operational amplifier 202 and to digital output 212. Variable gain operational amplifier 202 receives a signal from telecommunications line 102 and applies a variable predetermined amplification ratio to the signal. For example, variable gain operational amplifier 202 may be configured to add between zero to 40 decibels of amplification to a signal, adjustable in one-decibel steps. Variable gain operational amplifier 202 may also or alternatively be operable to adjust the amplification gain in smaller or continuous steps if suitable, and may have a maximum gain of more or less than 40 decibels.

Analog-to-digital converter 204 is coupled to the output of variable gain operational amplifier 202, and receives the amplified signal output by variable gain operational amplifier 202. Analog-to-digital converter 204 converts the analog signal to a digital signal. For example, analog-to-digital converter 204 may receive an analog signal that varies in voltage magnitude between −5 and +5 volts, and may convert the analog signal into a digital equivalent based upon the magnitude of the voltage. Thus, a voltage having a magnitude of zero may correspond to an output value of 128 out of 256, or "10000000" on an eight-bit binary scale. This digital number may be transmitted over digital output 212 in a serial or parallel format.

For example, the digital number may be transmitted in an 8-digit format over 8 parallel conductors, such that the eighth-most conductor carries a logical "one" and all other conductors carry a logical "zero." Alternatively, the number may be transmitted serially such that each bit is transmitted every clock period. In this serial format, an 8 digit binary number would require 8 clock cycles to be transmitted.

Digital output 212 is also coupled to digital-to-analog converter 206. Digital-to-analog converter 206 may be implemented in silicon, germanium, or other suitable materials. Digital-to-analog converter 206 receives a digital signal and converts it to an analog signal. For example, digital-to-analog converter 206 may receive a digital number having a value such as 128 on a scale from 0 to 256, and may convert this to a voltage of 0.0 on a scale from −5 to +5 volts.

Operational amplifiers 208 and 210 are connected to digital-to-analog converter 206, and form a "push-pull" amplifier pair for generation of an analog signal on telecommunications line 102. For example, each operational amplifier may be capable of generating a signal from zero to five volts in absolute magnitude. If the total voltage across telecommunications line 102 may vary from −5 to +5 volts, operational amplifiers 208 and 210 are used to create a maximum voltage magnitude difference from −5 to +5 volts.

In operation, coder-decoder 112 is used to receive a signal over telecommunications line 102 and to convert it to a digital output. Coder-decoder 112 uses a variable gain operational amplifier 202 to adjust the gain to compensate for signal attenuation due to circuit components that change with time, such as AC bypass path 106 which may be switched in and out of communication system 100. Thus, when such circuit components are removed, the gain of variable gain operational amplifier 202 may be decreased to prevent it from being driven into saturation. Likewise, when such circuit components are placed in the circuit, the gain of variable gain operational amplifier 202 may be used to compensate for signal loss developed across such components.

The gain of variable gain operational amplifier 202 may also be adjusted to compensate for the change in circuit gain that may be necessary as a result of changing values of circuit components, such as due to aging. The determination and setting of any required gain changes may be accomplished by a user, or automatically. An exemplary system in which automatic gain changes may be implemented would include a tone monitor, and would adjust the gain of variable gain operational amplifier 202 so that the amplitude of a calibrated reference tone transmitted over communications line 102 remains constant.

Figure 3:
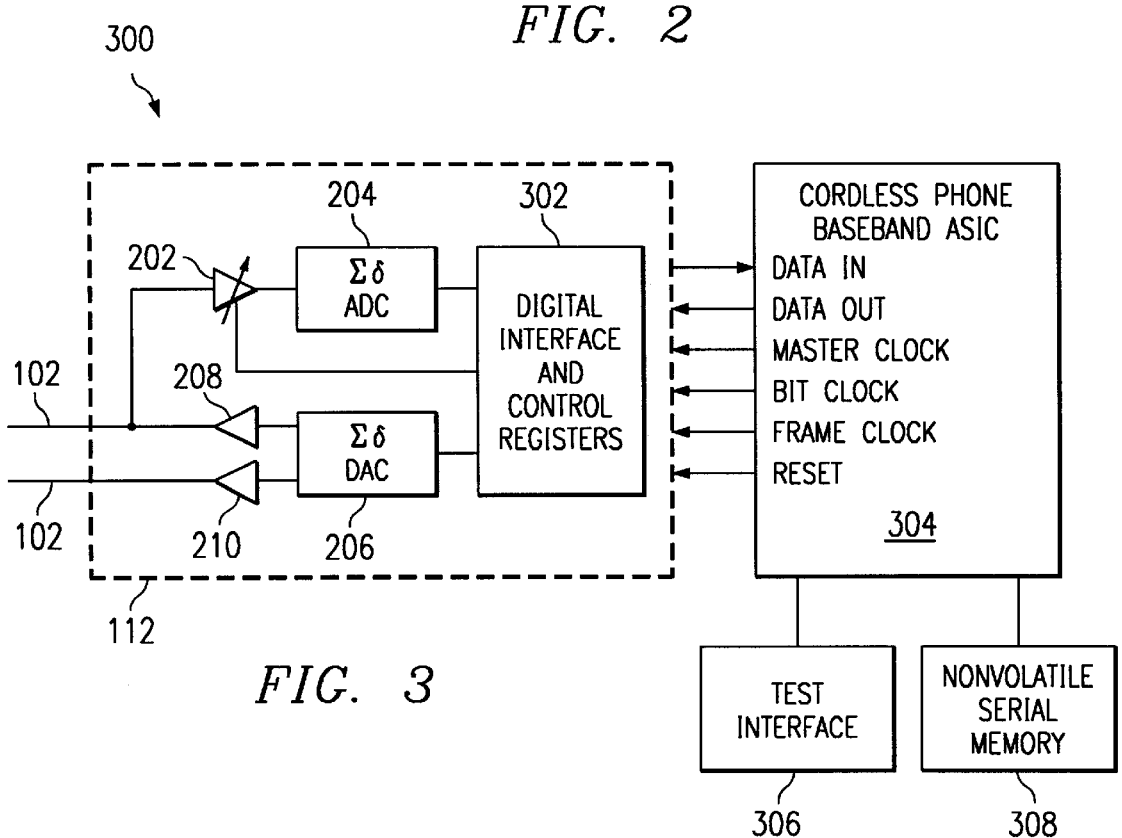
FIG. 3 is a block diagram of a communications system in accordance with teachings of the present invention.

FIG. 3 is a block diagram of a communications system 300 in accordance with an exemplary embodiment of the present invention. Communications system 300 includes coder-decoder 112 which is coupled to cordless phone baseband application-specific integrated circuit 304. Cordless phone baseband application-specific integrated circuit 304 is further coupled to test interface 306 and nonvolatile serial memory 308.

Coder-decoder 112 is a variable gain coder-decoder that is operational to receive a signal over telecommunications line 102 and to convert the signal from an analog signal into a digital signal. Variable gain operational amplifier 202 is coupled to sigma delta analog-to-digital converter 204. Digital interface and control registers 302 receives the digital converted output from analog-to-digital converter 204, and stores the output in digital interface and control registers 302 for subsequent transmission to external devices.

Digital interface and control registers 302 are also coupled to variable gain operational amplifier 202. For example, digital interface and control registers 302 may have one or more registers that store gain magnitude information for variable gain operational amplifier 202. Variable gain operational amplifier 202 is configured to selectively access the gain data that is stored in the one or more registers, so as to variably adjust gain. For example, variable gain operational amplifier 202 may have a hook and a hook gain value, where the hook gain value is used when a hook relay is on-hook, and a hook value that may be used when the hook relay is in a hook state.

Sigma delta digital-to-analog converter 206 is coupled to digital interface and control registers 302, and receives digital data in serial or parallel format. This digital data is used to modulate an analog signal of the output of sigma delta digital-to-analog converter 206, which is amplified by push-pull operational amplifiers 208 and 210. The analog signal is transmitted over telecommunications line 102.

Cordless phone baseband application-specific integrated circuit 304 may be implemented in silicon, germanium, or other suitable semiconducting materials. Cordless phone baseband application-specific integrated circuit 304 is operable to receive a digital signal from coder-decoder 112 and to process the digital signal in a predetermined manner. For example, cordless phone baseband application-specific integrated circuit 304 may generate commands that are transmitted to a cordless phone handset that cause the cordless phone to ring, receive commands from the cordless phone handset such as dial commands when the cordless phone handset is off-hook, and may transmit telecommunications channel data to and from the cordless phone handset after a telecommunications channel has been established using the handset.

Cordless phone baseband application-specific integrated circuit 304 includes a data-in lead from coder-decoder 112, and generates data out to coder-decoder 112. In addition, cordless phone baseband application-specific integrated circuit 304 provides a master clock signal, a bit clock signal, a frame clock signal, and a reset signal to coder-decoder 112. The data out signal received at coder-decoder 112 from cordless phone baseband application-specific integrated circuit 304 may include control data, such as amplification levels for variable gain operational amplifier 202 or other suitable control data.

Test interface 306 is coupled to cordless phone baseband application-specific integrated circuit 304, and allows a user to control the values stored in data registers of digital interface and control registers 302. For example, a user may select the values of amplification that variable gain operational amplifier 202 uses for off-hook and on-hook conditions, based upon the signal loss introduced by the various components in the system in which coder-decoder 112 is used. This feature of the present invention, among other things, allows a user to order coder-decoder 112 and include it in the design of the product prior to determining the final design for the product, and does not require the user to know the exact amount of signal attenuation that will need to be compensated for by the amplification circuitry of the coder-decoder.

Communications system 300 also includes nonvolatile serial memory 308, which is coupled to cordless phone baseband application-specific integrated circuit 304. Nonvolatile serial memory 308 may be used to store amplification values for variable gain operational amplifier 202. These amplification values are downloaded to registers of digital interface and control registers 302. For example, on startup or at other suitable times, cordless phone baseband application-specific integrated circuit 304 may query nonvolatile serial memory 308 for data, such as variable gain operational amplifier 202 amplification levels. These values may then be stored in digital interface and control registers 302, until power to coder-decoder 112 is removed or until other suitable times.

It should be noted that the nonvolatile serial memory 308 for each communication system 300 can be programmed either before the communication system 300 is installed for use, or by way of the test port 306 after the communication system 300 is installed for use. In this manner, coder-decoder 112 may be adjusted to compensate for any variations in path loss from line 102 to the input of coder-decoder 112 that may exist because of variations in external impedances, external amplification, or other sources of path loss variations.

In operation, communication system 300 is used to receive and decode digitally encoded data from an analog signal. When the communication system 300 is on-hook and an AC bypass path is used to transmit high-frequency data past the hook relay, variable gain operational amplifier 202 is used to selectively amplify the signal so as to compensate for AC bypass path loss. Analog-to-digital converter 204 converts the analog signal to a digital signal, which is then stored in digital interface and control registers 302 for subsequent transmission.

The converted data is then transmitted over a "data in" line to cordless phone baseband application-specific integrated circuit 304, which uses the data for a suitable purpose, such as to generate caller identification data for display on a caller identification display, such as one contained within the housing of the cordless phone.

Cordless phone baseband application-specific integrated circuit 304 may also generate a hook or off-hook signal based upon the data transmitted over "data in" line of cordless phone baseband application-specific integrated circuit 304. For example, cordless phone baseband application-specific integrated circuit 304 may determine that a phone should change state from on-hook to off-hook. Cordless phone baseband application-specific integrated circuit 304 may be operable to generate a change-of-state signal and to transfer the signal to coder-decoder 112 over the "data out" line. Coder-decoder 112 may also be operable to receive a hook state signal and to change the state of variable gain operational amp 202 by changing the gain register that is used to set the gain of variable gain operational amplifier 202.

Figure 4:
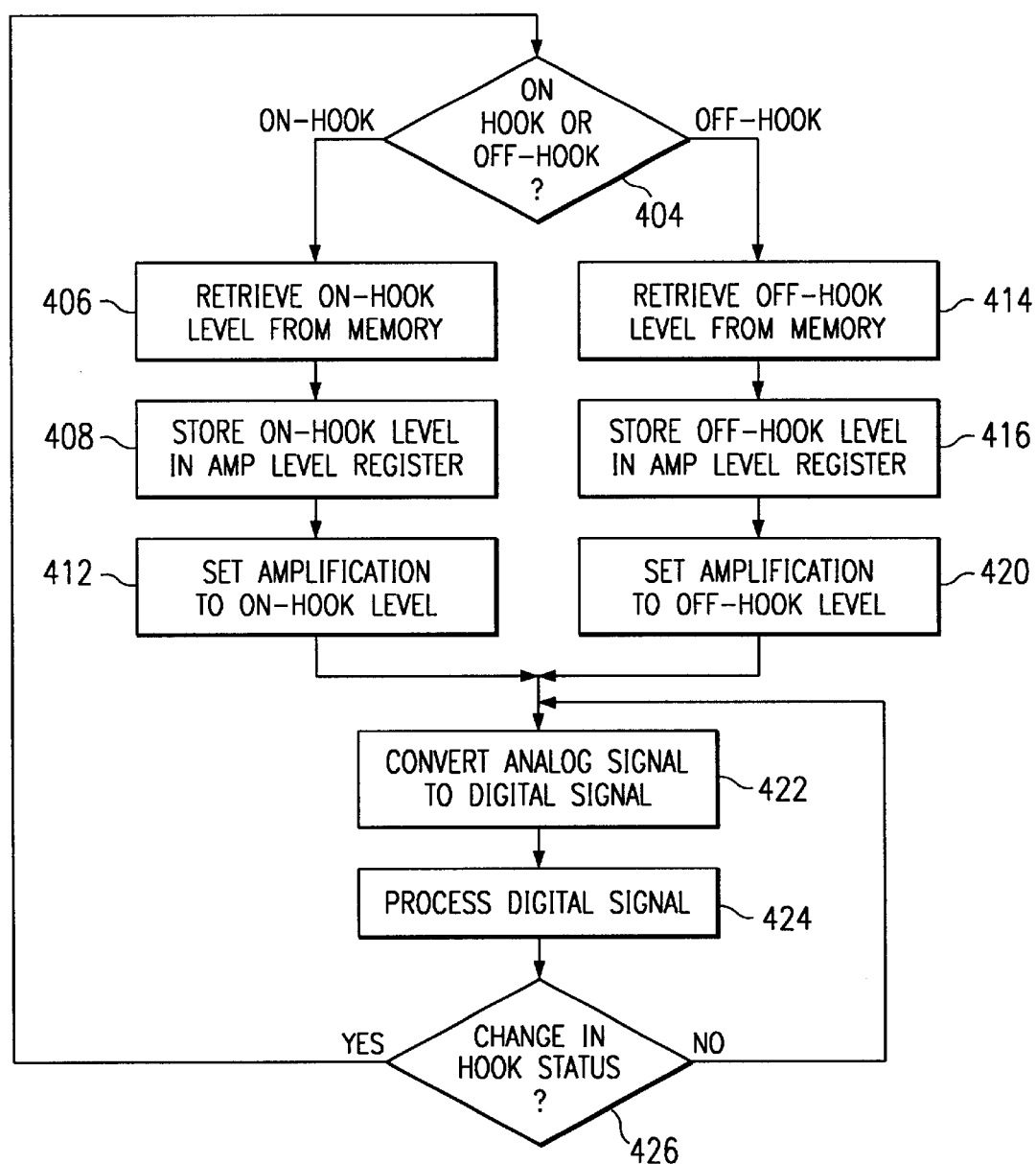
FIG. 4 is a flow chart of a method for processing a telecommunication signal in accordance with teachings of the present invention.

FIG. 4 is a flow chart of a method 400 for processing a telecommunications signal in accordance with teachings of the present invention. Method 400 may be used to controllably adjust the amplification of a variable gain operational amplifier in a coder-decoder.

Method 400 begins at 404, where the hook status is determined. The hook status may be determined by cordless phone baseband application-specific integrated circuit 304 or other suitable systems or components. For example, a signal which indicates hook status may be received. This signal may be generated by a relay device that is used to hold a handset (such as a hook relay), a keypad, a switch at the base station which is activated by a user, from a control command from a wireless handset, or by the presence of a ringing signal on line 102.

If it is determined whether the telephone is on-hook at 404, the method proceeds to 406 where a hook amplification level is retrieved from memory. For example, a hook amplification level may be read from a nonvolatile serial memory. The method then proceeds to 408 where the hook level is stored in a level register of a digital interface and control register, such as in a coder-decoder. The actions at 406 and 408 may also or alternatively be performed at startup. The method then proceeds to 412 where the operational amplifier amplification is set to the hook level.

If it is determined at 404 that an "off-hook" condition exists, the method proceeds to 414 where an off-hook amplification level is retrieved from memory. For example, a hook amplification level may be read from a nonvolatile serial memory. The method then proceeds to 416 where the hook level is stored in a level register of a digital interface and control register, such as in a coder-decoder. The actions at 414 and 416 may also or alternatively be performed at startup. The method then proceeds to 420 where the operational amplifier amplification is set to the hook level. The method then proceeds to 422.

At 422, an analog signal received at the input of the operational amplifier is amplified and transmitted to an analog-to-digital converter, where it is converted to a digital signal. This digital signal is output to a processor, such as a cordless phone baseband application-specific integrated circuit 304, and is processed at 424. The method then proceeds to 426, where it is determined whether processing is completed, such as by whether a change in hook status has occurred. When processing is completed, the method then returns to 404.

In operation, method 400 is used to control the amplification level of a line signal. For example, the line signal may carry on-hook caller identification data when a telephone handset coupled to the line is on-hook, and may receive an analog signal at a much higher level, such as off-hook caller identification data or a voice signal, when the telephone handset is off-hook. Method 400 is used to control the amplification level of an operational amplifier that processes the line signal such that the operational amplifier is not driven into saturation or damaged by the change in level between the hook and off-hook signal. Method 400 allows the signal attenuation created by the hook relay bypass circuitry to be compensated for when the system status is on-hook, and allows the compensation gain to be adjusted when the system is off-hook to prevent saturation and distortion of the signal.

The variable gain coder-decoder of the present invention provides many important technical advantages. One important technical advantage of the present invention is a variable gain coder-decoder that may be used to process signals having a variable input level, such that a weak signal may be processed until such time as a stronger signal is received. The gain of the variable gain coder-decoder may then be adjusted in one-decibel steps so as to prevent the amplifier of the variable gain coder-decoder from being driven into saturation.

Although preferred and exemplary embodiments of variable-gain coder-decoders and systems and methods for using variable gain coder-decoders have been described in detail herein, those skilled in the art will also recognize that various substitutions and modifications may be made to the systems and methods without departing from the scope and spirit of the appended claims.

What is claimed is:

1. A variable-gain coder-decoder comprising:

a variable gain amplifier, adjustable in one decibel steps; and an analog to digital converter coupled to the variable gain amplifier.

2. The variable coder-decoder of claim 1 further comprising:

a digital to analog converter coupled to the analog to digital converter; and an amplifier coupled to the digital to analog converter.

3. The variable gain coder-decoder of claim 1 wherein the analog to digital converter is a sigma delta analog to digital converter.

4. The variable gain coder-decoder of claim 2 wherein the digital to analog converter is a sigma delta digital to analog converter.

5. The variable gain coder-decoder of claim 1 wherein the amplifier is a push-pull operational amplifier set.

6. The variable gain coder-decoder of claim 2 further comprising a digital interface and control system coupled to the variable gain amplifier, the analog to digital converter, and the digital to analog converter, the digital interface and control system operable to store a decibel gain value in a predetermined memory location, such that the gain of the variable gain amplifier equals the decibel gain value in the predetermined memory location.

7. The variable gain coder-decoder of claim 6 further comprising a non-volatile memory coupled to the digital interface and control system, wherein a user may store a gain value in the non-volatile memory.

8. A system for transferring data over a communications medium having a variable impedance load comprising:

a relay coupled to the communications medium, the relay operable to selectively block and transmit an off-hook data signal from the communications medium;

a AC bypass path coupled in parallel with the relay;

a variable-gain coder-decoder coupled to the AC bypass path and the relay; and wherein the variable gain coder-decoder amplifies an on-hook data signal at a first predetermined level when the relay is blocking, and amplifies the off-hook data signal at a second predetermined level when the relay is transmitting.

9. The system of claim 8 wherein the relay is a telephone off-hook relay.

10. The system of claim 8 wherein the AC bypass path is a resistor connected in series with a capacitor.

11. The system of claim 8 wherein the variable gain coder-decoder comprises a variable gain operational amplifier in series with an analog to digital converter.

12. The system of claim 8 wherein the variable gain coder-decoder is adjustable in one decibel steps.

13. The system of claim 8 further comprising an amplification register coupled to the variable gain coder-decoder, the amplification register operable to store one or more predetermined amplification levels for use by the variable gain coder-decoder.

14. The system of claim 8 further comprising a user interface coupled to the amplification register, wherein a user may store an amplification level in the amplification register using the user interface.

15. The system of claim 8 further comprising a caller identification system coupled to the variable gain coder-decoder, the caller identification system operable to receive the on-hook data signal and to generate a caller identification display.

16. A method for processing a line signal comprising:

setting the amplification gain of the line signal to a first predetermined value when a relay is in a blocking state; and setting the amplification gain of the line signal to a second predetermined value when the relay is in a non-blocking state.

17. The method of claim 16 wherein the first predetermined value is equal to the loss in decibels of the line signal across an AC bypass path.

18. The method of claim 16 wherein the second predetermined value is equal to the gain required for an off-hook data signal that is received from the network.

19. The method of claim 16 wherein the first predetermined value is equal to the gain required for a caller identification signal that is received from the network.

20. The method of claim 16 wherein the first predetermined value is equal to the gain required for an analog display services interface signal that is received from the network.

* * * * *